(12) United States Patent
Prokopowicz et al.

(10) Patent No.: US 10,474,032 B2
(45) Date of Patent: *Nov. 12, 2019

(54) COATING COMPOSITIONS

(71) Applicant: Rohm and Haas Electronic Materials LLC, Marlborough, MA (US)

(72) Inventors: Gregory P. Prokopowicz, Worcester, MA (US); Michael K. Gallagher, Hopkinton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/543,460

(22) Filed: Nov. 17, 2014

(65) Prior Publication Data

US 2015/0072290 A1   Mar. 12, 2015

Related U.S. Application Data

(62) Division of application No. 11/417,374, filed on May 4, 2006, now Pat. No. 8,889,344.

(60) Provisional application No. 60/682,941, filed on May 19, 2005, provisional application No. 60/678,032, filed on May 4, 2005.

(51) Int. Cl.
| | |
|---|---|
| *G03F 7/09* | (2006.01) |
| *G03F 7/11* | (2006.01) |
| *G03F 7/20* | (2006.01) |
| *C08K 3/36* | (2006.01) |
| *C09D 129/04* | (2006.01) |
| *C09D 133/02* | (2006.01) |

(52) U.S. Cl.
CPC ............... *G03F 7/091* (2013.01); *C08K 3/36* (2013.01); *C09D 129/04* (2013.01); *C09D 133/02* (2013.01); *G03F 7/11* (2013.01); *G03F 7/2041* (2013.01)

(58) Field of Classification Search
CPC . G03F 7/09; G03F 7/091; G03F 7/092; G03F 7/20; G03F 7/2041; C08K 3/36
USPC ................ 430/271.1, 272.1, 273.1
See application file for complete search history.

(56) References Cited

U.S. PATENT DOCUMENTS

| | | | | |
|---|---|---|---|---|
| 4,072,527 | A  * | 2/1978 | Fan ........................... | 430/273.1 |
| 5,597,677 | A  * | 1/1997 | Kangas ..................... | G03F 7/11 |
| | | | | 430/143 |
| 6,458,467 | B1 * | 10/2002 | Mizuno et al. ............... | 428/480 |
| 6,824,952 | B1 * | 11/2004 | Minsek .................... | G03F 7/091 |
| | | | | 430/156 |
| 7,781,141 | B2 * | 8/2010 | Gallagher et al. ......... | 430/270.1 |
| 8,889,344 | B2 * | 11/2014 | Prokopowicz et al. ...... | 430/326 |
| 2005/0202340 | A1* | 9/2005 | Houlihan et al. .......... | 430/270.1 |
| 2006/0105272 | A1* | 5/2006 | Gallagher et al. ............ | 430/311 |
| 2006/0211785 | A1 | 9/2006 | Aoai | |
| 2011/0233048 | A1 | 9/2011 | Kuramoto et al. | |
| 2014/0356785 | A1 | 12/2014 | Williams, III et al. | |
| 2015/0362836 | A1 | 12/2015 | Tsuchimura et al. | |

FOREIGN PATENT DOCUMENTS

| | | |
|---|---|---|
| JP | H 11-274129 A | 10/1999 |
| KR | 10-2011-0106859 | 3/2013 |
| TW | 201029961 A | 8/2010 |
| TW | 201439062 A | 10/2014 |

OTHER PUBLICATIONS

Zirconium Dioxide (1314-23-4), Chemical Book, 2008.*
Final Office Action issued in counterpart Korean Application No. 10-2016-0054286 (4 pages).
English language summary of Office Action and Search Report issued in Taiwan counterpart apopplication 106-2(60()091190-10620224230, 2017 (4 pages).
English language summary of Office Action dated Apr. 13, 2017 issued in Japanese counterpoart Application No. 2016-088986 (3 pages).

* cited by examiner

*Primary Examiner* — Anca Eoff
(74) *Attorney, Agent, or Firm* — Mintz Levin Cohn Ferris Glovsky and Popeo, P.C.; Peter F. Corless

(57) ABSTRACT

In one aspect, coating compositions are provided that comprise a component a component that comprises one or more silicon, antimony, aluminum, yttrium, cerium, lanthanum, tin, titanium, zirconium, hafnium, indium or zinc compounds. In another aspect, coating compositions are provided that comprise a plurality of discrete particles. Preferred coating compositions of the invention are useful for antireflective purposes, particularly with an underlaying photoresist coating layer, as well as for a barrier layer in immersion lithography.

19 Claims, 2 Drawing Sheets

COATING COMPOSITIONS

The present application is a Divisional Application of U.S. patent application Ser. No. 11/417,374, filed May 4, 2006, which claims the benefit of both U.S. provisional application No. 60/678,032 filed May 4, 2005, and U.S. provisional application No. 60/682,941 filed May 19, 2005, the contents of which applications are incorporated herein by reference.

In one aspect, the present invention relates to coating compositions that comprise a component that has one or more silicon, antimony, aluminum, yttrium, cerium, lanthanum, tin, titanium, zirconium, hafnium, indium and/or zinc compounds. In another aspect, the invention includes coating compositions that comprise a plurality of particles. Preferred coating compositions of the invention are useful for antireflective purposes, particularly with an associated photoresist coating layer. Coating compositions of the invention also are useful as photoresist overcoat layers in immersion lithography processing. In a particular aspect, top (overcoated) antireflective compositions are provided.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Light scattering or interference caused by light reflecting from an interface between two layers with differing refractive indices, such as between resist and underlying substrate interface or resist and air interface can result in undesired alterations of the dimensions of the exposed region of a photoresist coating layer. Preferred refractive indices of top anti reflective layers have been calculated from the following equation:

$$n_{TARC} = \sqrt{n_{Resist} \times n_{Air}}$$

Several efforts have been made to reduce such undesired radiation reflections, including use of antireflective layers positioned under a photoresist layer (often referred to as "bottom" antireflective layers) as well as antireflective layers positioned above a photoresist layer (often referred to as "top" antireflective layers). See U.S. Pat. No. 6,503,689.

Top antireflective compositions commonly have employed a fluorinated component e.g. to provide a desired refractive index of the composition. The refractive index of such fluorinated materials has been higher than desired for optimal reflection control at 248 nm and 193 nm radiation. Moreover, environmental issues have been raised with respect to various fluorinated components.

Additionally, electronic device manufacturers continually seek increased resolution of a photoresist image patterned over antireflective coating layers and in turn demand ever-increasing performance from an antireflective composition.

An approach to achieving smaller feature sizes is to use shorter wavelengths of light, however, the difficulty in finding materials that are transparent below 193 nm has led to the option of using immersion lithography to increase the numerical aperture of the lens by simply using a liquid to focus more light into the film. Immersion lithography employs a relatively high refractive index fluid between the last surface of an imaging device (e.g., KrF or ArF stepper) and the first surface on a wafer or other substrate.

Extensive and proven immersion lithography systems do not yet exist. Reliable and convenient photoresist and imaging processes for immersion lithography are clearly needed.

It thus would be desirable to new materials for microlithography, including compositions useful in antireflective and immersion lithography applications.

We now provide new coating compositions that can be particularly useful for as an antireflective layer, barrier coat or immersion barrier layer for an associated photoresist composition layer.

Preferred coating compositions of the invention may have an index of refraction that can be matched to the desired index of refraction, at the appropriate wavelength of photoresist exposure radiation, through the control of density in the film and the composition of the film.

In one aspect, coating compositions of the invention comprise one or more components that comprise one or more silicon, antimony, aluminum, yttrium, cerium, lanthanum, tin, titanium, zirconium, hafnium, indium and/or zinc compounds.

In another aspect, coating compositions of the invention comprise a plurality of particles, preferably inorganic materials comprising one or more of silicon dioxide ($SiO_2$), antimony oxide ($Sb_2O_5$), cerium oxide ($CeO_2$), yttria stabilized zirconium oxide, antimony doped tin oxide, yttrium oxide ($Y_2O_3$), lanathanum oxide ($La_2O_3$), tin oxide ($SnO_2$), titanium oxide (TiO2), zirconium oxide ($ZrO_2$), hafnium oxide ($HfO_2$), indium oxide ($In_2O_3$) or zinc oxide (ZnO). Such particles also may be organic and contain carbon, oxygen, or one or more hetero O, N or S) or halogen atoms. Particles of hyperbranched polymers may be particularly preferred.

Preferred coating compositions of the invention are useful for antireflective purposes, particularly with an associated photoresist coating layer. Coating compositions of the invention also are useful as photoresist overcoat layers in immersion lithography processing. In a particular aspect, top (overcoated) antireflective compositions are provided.

In a further aspect, coating compositions of the invention comprise one or more components that comprise one or more groups containing silicon, hafnia and/or zirconia compounds. Coating components that comprise a silicon-containing component are particularly preferred.

Preferred silicon-containing component of such coating compositions of the invention will have a high Si content, e.g. at least 10, 20, 30, 50 or 50 atom weight percent of the total component being Si. Preferred silicon-containing components also may have a relatively high portion of silicon oxide, silicon nitride, or silicon carbide repeat units. Similarly, preferred antimony, aluminum, yttrium, cerium, lanthanum, tin, titanium, zirconium, hafnium, indium or zinc-containing compounds may have a relatively high portion of oxide, nitride, carbide or silicide repeat units. Mixtures of one or more silicon, antimony, aluminum, cerium, yttrium, lanthanum, tin, titanium, zirconium, hafnium, indium or zinc compounds may also be used. References herein to inorganic materials or inorganic particles indicates materials or particles that comprise silicon, antimony, aluminum, yttrium, cerium, lanthanum, tin, titanium, zirconium, hafnium, indium and/or zinc, preferably in the substantial absence (e.g. less than 10 or 5 weight mole %) or complete absence of carbon.

In another aspect, coating compositions of the invention comprise a plurality of particles. Such particles may include polymers that are polymerized in the form discrete particles, i.e. as separate and distinct polymer particles. Such polymer particles typically have one or more different characteristics from linear or ladder polymers such as linear or ladder silicon polymers. For example, such polymer particles may have a defined size and a low molecular weight distribution.

Inorganic particles are often preferred components of coating compositions of the invention and may suitably comprise one or more silicon, antimony, aluminum, yttrium, cerium, lanthanum, tin, titanium, zirconium, hafnium, indium and/or zinc compounds. Such particles may include polymers that are polymerized in the form discrete inorganic particles. Moreover, hybrid particles may also be used. Hybrid particles are composites of inorganic particles and organic polymers. These may be separate or discrete domains of the inorganic particle and organic polymer. For example, such inorganic or hybrid particles may have a defined size and a narrow particle size distribution. Selection of a specific inorganic particle or hybrid particle is based on ability to affect the index of refraction without significant absorption of the radiation of interest. Thus titanium oxide is suitable for 365 nm exposure but may be less preferred for 193 nm exposure due to absorption at this wavelength. Appropriate materials also can be identified based on the real and imaginary components of the index of refraction (n and k) used to image a photoresist layer associated with a coating composition of the invention.

In a preferred aspect, a plurality of the polymer particles of the invention typically has a mean particle size (dimension) of from 5 to 3000 angstroms, more preferably from 5 to 2000 angstroms, still more preferably from 5 to 1000 angstroms, yet more preferably from 10 to 500 angstroms, even more preferably from 10 to 50 or 200 angstroms. For many applications, particularly preferred particles have a mean particle size of less than 100 angstroms.

Such particles preferably may comprised of one or more silicon, antimony, aluminum, yttrium, cerium, lanthanum, tin, titanium, zirconium, hafnium, indium and/or zinc compounds. Particularly preferred particles for use in coating compositions of the invention include colloidal particles comprised of one or more silicon oxide(s), zirconium oxide(s) and/or hafnium oxide(s).

Preferred coating compositions of the invention also can be readily removed as desired such as through application of an aqueous composition, including aqueous alkaline compositions such as used for photoresist development. Preferred coating compositions of the invention also can exhibit low metal contents (e.g. low sodium content) making the composition particularly suitable for microelectronic applications. In a yet further aspect of the invention, coating compositions are provided that are substantially or completely free of fluorinated components, particularly a fluorinated resin.

Particularly preferred applied coating compositions of the invention can be removed by disposing an aqueous coating compositions such as an alkaline developer or a fluoride salt composition.

Coating compositions of the invention are suitably formulated as fluid compositions, e.g. as aqueous-based compositions including aqueous-based compositions that may optionally include one or more organic co-solvents such as an alcohol, ether e.g. $C_{2-16}$ alcohols, glycol ethers, ketones, esters, carboxylic acids such as acetic acid. Preferred compositions have a solvent component that is predominately aqueous, e.g. where the solvent carrier is at least 50, 60, 70, 80, 90, 95 or 100 volume percent water.

In a yet further aspect of the invention, coating compositions are provided that contain one or more acids or acid generator compounds. It has been surprisingly found that addition of an effective amount of an acid source in a coating composition can provide enhanced resolution of an image patterned in an underlying photoresist layer. See, for instance, the comparative results set forth in Example 14 and FIGS. 1-3 which follow.

It also has been surprisingly found that inclusion of an acid additive in a coating composition of the invention can reduce undesired residues after lithographic processing of a photoresist overcoated with a composition of the invention. Additives containing one or more carboxylic acid groups or protected carboxylic acid groups such as ester moieties can be particularly effective in reduction of undesired residues remaining on processed substrate (e.g. microelectronic wafer) surfaces.

We also have surprisingly found that coating composition of the invention that contain polymeric additives having hetero substitution such as hydroxyl can result in reduced undesired residues after lithographic processing of a photoresist overcoated with a composition of the invention. Addition of a poly(vinyl alcohol) to a coating composition has been notably effective in this regard.

In a yet further aspect of the invention, coating compositions are provided that are substantially free (e.g. less than 10, 5 or 2 weight percent of fluid composition) or completely free of fluorinated components, particularly a fluorinated resin.

Coating compositions of the invention are suitably formulated as fluid compositions, e.g. as aqueous-based compositions including aqueous-based compositions that may optionally include one or more organic co-solvents such as an alcohol, ether e.g. $C_{2-16}$ alcohols, glycol ethers, ketones, esters, carboxylic acids such as acetic acid. Preferred compositions have a solvent component that is predominately aqueous, e.g. where the solvent carrier is at least 50, 60, 70, 80, 90, 95 or 100 volume percent water.

In a preferred aspect of the invention, coated substrates are provided including a coated substrate comprising: (a) a coating layer of a photoresist composition; and (b) above the photoresist composition, an applied aqueous composition comprising a plurality of particles. In a further preferred aspect, coated substrates also are provided that comprise (a) a coating layer of a photoresist composition; and (b) above the photoresist composition, an applied aqueous composition comprising a component that comprises one or more of silicon, antimony, aluminum, yttrium, cerium, lanthanum, tin, titanium, zirconium, hafnium, indium and/or zinc compounds. References that the "applied" composition is aqueous indicate that the composition is formulated as an aqueous-based composition, even if the water is at least substantially removed after application of the composition such as by spin-drying. In a yet further preferred aspect, coated substrates are provided that comprise (a) a coating layer of a photoresist composition; and (b) above the photoresist composition, a composition comprising colloidal silica.

In additional preferred aspects, the invention includes methods for processing an electronic device substrate, comprising (a) applying a photoresist layer on substrate; and (b) applying above the photoresist layer an aqueous composition comprising a plurality of particles. The invention also provides methods for processing an electronic device substrate, comprising: (a) applying a photoresist layer on substrate; and (b) applying above the photoresist layer an aqueous composition that comprises one or more compounds that comprise one or more of silicon, antimony, aluminum, yttrium, cerium, lanthanum, tin, titanium, zirconium, hafnium, indium and/or zinc compounds. Particularly preferred methods of the invention include methods for processing an electronic device substrate, comprising: (a) applying a photoresist layer on substrate; and (b) applying above the photoresist layer an aqueous composition that comprises colloidal silica, hafnia and/or zirconia.

Coating compositions of the invention suitably may be applied to a surface (e.g. over a photoresist coating layer) by any number of means, including dip coating, roller coating, slot coating, spray coating, chemical vapor deposition or preferably spin coating. After application of a coating composition of the invention, a multilayer system (i.e. photoresist layer with overcoated layer of a coating composition of the invention) may directly further lithographically processed (e.g. imaged with patterned activating radiation such as having a wavelength of 365 nm, 248 nm or 193 nm), or the applied coating layer may be cured otherwise set such as by thermal treatment e.g. 80° C. or more or 140° C. or more for 30 to 60 seconds or more.

More particularly, coating compositions of the invention may be suitably employed in a lithographic process as follows:

1) apply a photoresist composition (e.g. by spin coating) to a substrate such as a semiconductor wafer. The photoresist may be suitably applied on the wafer surface or a material previously applied over the wafer such as an organic or inorganic planarizing layer;

2) optionally thermally treat the applied photoresist composition to remove solvent carrier, e.g. at 120° C. or less for 30 to 60 seconds;

3) above the photoresist composition, apply a coating composition of the invention, e.g. by spin coating a fluid formulation of the coating composition. The coated substrate optionally then may be thermally treated to remove solvent carrier of the barrier composition, although as discussed above the substrate with multiple coating layers can be directly lithographically processed with a further drying step of the overcoated coating composition of the invention;

4) exposing the overcoated photoresist layer to patterned activating radiation e.g. sub-400 nm, sub-300 nm or sub-200 nm radiation such as radiation having a wavelength of 365 nm, 248 nm or 193 nm. The coated substrate also may be imaged in an immersion lithography system with a fluid (e.g. a fluid comprising water) interposed between the exposure tool and the coated substrate, i.e. immersion exposing the photoresist layer by a fluid layer interposed between the exposure tool and the layer of a coating composition of the invention. The interposed fluid typically contacts the overcoated composition layer;

5) developing the exposed coating layers such as with an aqueous alkaline developer composition regularly employed for photoresist development. The developer composition can remove the overcoated coating composition of the invention as well as imaged areas of the photoresist composition in the case of a positive-acting resist, or non-exposed resist coating layer areas in the case of a negative-acting resist.

Also, if desired, during lithographic processing, the coated substrate may be washed with a solvent composition, which can reduce the occurrence of defects on the processed microelectronic wafer. The solvent treatment composition may be an aqueous composition (e.g. water or water/organic mixture) or a non-aqueous component and comprise one or more organic solvents, preferably one or more polar solvents such as one or more alcohols such as isopropanol, and/or more or more additives such as a fluoride compound including an ammonium fluoride compound. After treating a coated substrate, the solvent composition then may be substantially removed such as by further spinning. Suitably, such a wash step may be conducted after exposure, either before or after development, or a fluid composition wash step may be conducted both before or after development. A pre-development wash can effectively remove the coating composition overcoated the photoresist layer, and a post-development wash step to minimize or eliminate any undesired residues remaining on the processed substrate surface.

Preferred imaging wavelengths of lithographic systems of the invention include sub 400 nm-wavelengths such as 365 nm, sub-300 nm wavelengths e.g. 248 nm, and sub-200 nm wavelengths e.g. 193 nm. Higher imaging wavelengths also may be employed, i.e. Particularly preferred photoresists for use in accordance with the invention may contain a photoactive component (e.g. one or more photoacid generator compounds, or a diazonaphthoquinone photoactive component for photoresists imaged at higher wavelengths including wavelengths in excess of 300 nm and 400 nm such as 365 nm and 436 nm) one or more resins that are chosen from among:

1) A phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, as well as blends of i) and/or ii) and/or iii);

2) Phenolic resins that do not contain acid-labile groups such as poly(vinylphenol) and novolak resins that may be employed in I-line and G-line photoresists together with a diazonaphthoquinone photoactive compound and have been described e.g. in U.S. Pat. Nos. 4,983,492; 5,130,410; 5216111; and 5529880;

3) A resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462; and iii) polymers that contain polymerized anhydride units, particularly polymerized maleic anhydride and/or itaconic anhydride units, such as disclosed in European Published Application EP01008913A1 and U.S. Pat. No. 6,048,662, as well as blends of i) and/or ii) and/or iii);

4) A resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914.

5) Resins that contain Si-substitution including poly(silsequioxanes) and may be used with an undercoated layer. Such resins are disclosed e.g. in U.S. Pat. No. 6,803,171.

6) a resin that contains fluorine substitution (fluoropolymer), e.g. as may be provided by polymerization of tetrafluoroethylene, a fluorinated aromatic group such as fluorostyrene compound, compounds that comprise a hexafluoroalcohol moiety. Examples of such resins are disclosed e.g. in PCT/US99/21912. Such fluorinated resins may be particularly useful for imaging at short wavelengths such as sub 300 nm and sub-200 nm, including 193 nm and 157 nm.

The invention further provides methods for forming a photoresist relief image and producing an electronic device. The invention also provides novel articles of manufacture comprising substrates coated with a coating composition of the invention alone or in combination with a photoresist composition.

Coating compositions of the invention will be useful for a number of additional applications. In particular, coating compositions of the invention will be useful for the manufacture of light guide including wave guides, e.g. to provide a low index cladding material. Coating compositions of the invention also will be useful for treatment of a variety of optical devices, e.g. to apply as an antireflective or anti-glare layer. More particularly, coating compositions may be applied as a coating layer on the lens of a phototool used in microlithography applications. Coating compositions of the invention also may be useful to avoid or reduce glare or to provide scratch resistance on a variety of substrates including e.g. eyeglasses, windshields, and computer screens.

The invention also includes devices produced using coating compositions of the invention, including semiconductor chip and other integrated circuit substrates processed using a coating composition of the invention. The invention further includes apparatus that contains such processed integrated circuits, such as electronic devices that contain one or more such processed integrated circuits.

Other aspects of the invention are disclosed infra.

We now provide new coating compositions that can be particularly useful as antireflective layer, barrier coat or immersion barrier layer between a radiation source and a photoresist layer.

In one aspect, coating compositions of the invention comprise one or more components that comprise one or more silicon, antimony, aluminum, yttrium, cerium, lanthanum, tin, titanium, zirconium, hafnium, indium and/or zinc compounds.

In another aspect, coating compositions of the invention comprise a plurality of particles, preferably inorganic materials comprising one or more of silicon dioxide ($SiO_2$), antimony oxide, cerium oxide, yttria stabilized zirconium oxide, antimony doped tin oxide, yttrium oxide ($Y_2O_3$), lanathanum oxide ($La_2O_3$), tin oxide (SnO), titanium oxide ($TiO_2$), zirconium oxide ($ZrO_2$), hafnium oxide ($HfO_2$) or zinc oxide (ZnO). As discussed above, particles having organic content also may be employed. Thus, for instance, in one preferred aspect, particles such as silica particles may be surface modified including with organic materials such as to provide particle surface modified with covalently linked propylene ethylene oxide (PEO)-silanes, PPO-silanes, carboxylic acids, fluoroalcohols such as hexafluoroalcohols and other fluoroaclohols suitably having 1 to 20 carbon atoms, and haloalkyls including perfluoroalkyls and other fluoroalkyls suitably having 1 to about 20 carbon atoms.

Preferred coating compositions of the invention are removable during lithographic processing, including with an aqueous alkaline developer that may be employed to develop (remove) exposed regions of an undercoated positive-acting photoresist layer. Preferred coating compositions of the invention also can be employed without cross-linking or other hardening of a coating composition layer. Thus, preferred coating compositions of the invention can be free of a crosslinker component, or other material that otherwise would be employed to facilitate curing of the composition coating layer.

As discussed further below, coating compositions of the invention may comprise organic and/or inorganic components. Preferred coating compositions of the invention are formulated as aqueous-based fluid compositions, e.g. fluid compositions where the only solvent carrier is water as well as fluid compositions that may comprise water admixed with one or more other miscible fluid components including one or more water-miscible organic solvents, typically where water is at least 60 weight percent of the fluid carrier component, with water more preferably 80, 90, 95 or 100 weight percent of the fluid carrier component.

While the coating composition generally may be within a wide range of pH values, in one aspect, for many applications, preferably an aqueous-based coating compositions of the invention will have a pH of from 2 to 10.5, more preferably a pH of from 2 or 3.5 to 6 or 10.5. In particularly preferred aspects, aqueous-based coating compositions of the invention will have a pH of from 1 to 10.5, more preferably a pH of from 2 to 4.5, still more preferably 2 to 3.

Preferred coating compositions of the invention also will be substantially free of trace metals. For example, preferred coating compositions of the invention will have undesired metals at levels of less than 1 ppm, preferably less than 100 ppb. Undesired metals may include heavy metals, alkali metals such as sodium, transitional and/or rare earth metals. Preferred coating compositions of the invention also will have such low levels of other undesired materials such as chloride ions.

Preferred coating compositions of the invention are disposed from solution, and more preferably from aqueous solution as discussed above. Coating compositions also may be disposed on a surface by other methods including chemical vapor deposition, spray coating, "ink-jetting", spray pyrolysis or other processes for disposing thin film onto a substrate. The coating compositions of the present invention may comprise colloidal particles such as one or more one or more silicon, antimony, aluminum, yttrium, cerium, lanthanum, tin, titanium, zirconium, hafnium, indium or zinc compounds. These materials are often prepared in water or alcohols. Surface modification of the colloidal particle can be done e.g. to improve the stability in solution or enhance the properties of the colloidal particle. For instance, surface modification can include covalent linkage of PEO-silanes, PPO-silanes, carboxylic acids, fluoroalcohols e.g. suitably having 1 to 20 carbon atoms, and fluoralkyls e.g. suitably having 1 to 20 carbon atoms. Modification of the surface, can for example, improve the stability of a dispersion of the colloidal particle in a non-aqueous solvent. Coating components that comprise a silicon-containing component are particularly preferred.

Preferred particles are dispersed or synthesized in solution and then transferred to the desired solvent. Preferred particles may be functionalized e.g. the surface of colloidal particles may contain hydroxyl groups that can be functionalized with compounds such as silane coupling agents to affect the stability of the dispersion of the colloidal particles. In addition these surface functional agents can also be used to impart other properties to the film such as absorption at a particular wavelength or reactive groups that can crosslink the particles to form a stable film.

In a further aspect, preferred coating compositions of the invention may be formulated as aqueous coating composition and preferably are removable with aqueous alkaline developer or fluoride containing remover. The coating compositions may comprises (i) a plurality of particles comprising colloidal silica, hafnia or zirconia; (ii) one or more resins; (iii) one or more acids which preferably can assist stabilization of the composition; (iv) one or more surfactants; and optionally (v) one or more co-solvents in addition to water.

Components of Coating Compositions
Components that Comprise One or More Silicon, Antimony, Aluminum, Yttrium, Cerium, Lanthanum, Tin, Titanium, Zirconium, Hafnium, Indium or Zinc Compounds As discussed above, in a first aspect, coating compositions are provided that comprise a component that comprise one or more silicon, antimony, aluminum, yttrium, cerium, lanthanum, tin, titanium, zirconium, hafnium, indium or zinc compounds. Compositions that comprise a silicon-containing component are particularly preferred. Preferred silicon-containing component of such coating compositions of the invention will have a high Si content, e.g. at least 10, 20, 30, 40 or 50 atom weight percent of the total component being Si. Preferred silicon-containing components also may have a relatively high portion of $SiO_2$ repeat units, e.g. where at least 20 percent of total polymer units of an Si-containing polymer are $SiO_2$, or where at least 40, 50, 60, 70, 80, 90 or 100 percent of total number of polymer units of an Si-containing polymer are $SiO_2$.

Such composition components that contain one or more silicon, antimony, aluminum, yttrium, cerium, lanthanum, tin, titanium, zirconium, hafnium, indium or zinc compounds may be organic or inorganic. Inorganic components particularly suitable for the present invention include one or more oxide of silicon, zirconium or hafnium e.g. $SiO_2$, $HfO_2$ or $ZrO_2$. Such moieties also may be surface functionalized e.g. to improve the stability of the particle dispersion with organic groups such as $C_{1-20}$alkyl, $C_{1-20}$alkoxy, and/or $C_{1-20}$thioalkyl grafted thereon, and other groups as discussed above.

While inorganic materials or surface-modified inorganic materials may be preferred for many applications, organic polysilica components also may be employed in an overcoated coating compositions of the invention and may be prepared using a partial condensate of one or more organosilanes and one or more silicon-containing cross-linking agents, wherein the cross-linking agent contains >4 hydrolyzable groups. Suitable silicon-containing cross-linking agents have 5 or 6 hydrolyzable groups. As used herein, the term "partial condensate" refers to a silane oligomer or prepolymer or hydrolyzate that is capable of undergoing further condensation reactions to increase its molecular weight.

Such organic polysilica partial condensates may be suitably prepared methods that include the steps of: a) reacting a mixture including one or more silanes of formula (I) $R_aSiY_{4-a}$ and one or more silanes of formula (II) $R^1{}_b(R^2O)_{3-b}Si(R^3)_cSi(OR^4)_{3-d}R^5{}_d$ in the presence of a basic catalyst; and b) reacting the mixture in the presence of an acidic catalyst; wherein R is hydrogen, $(C_1-C_8)$alkyl, $(C_7-C_{12})$arylalkyl, substituted $(C_7-C_{12})$arylalkyl, aryl, and substituted aryl; Y is any hydrolyzable group; a is an integer of 1 to 2; $R^1$, $R^2$, $R^4$ and $R^5$ are independently selected from hydrogen, $(C_1-C_6)$alkyl, $(C_7-C_{12})$arylalkyl, substituted $(C_7-C_{12})$aryl-alkyl, aryl, and substituted aryl; $R^3$ is $(C_1-C_{10})$alkyl, —$(CH_2)_h$—, —$(CH_2)_{h1}$-$E_k$-$(CH_2)_{h2}$—, —$(CH_2)_h$—Z, arylene, substituted arylene, or arylene ether; E is oxygen, $NR^6$ or Z; Z is aryl or substituted aryl; $R^6$ is hydrogen, $(C_1-C_6)$alkyl, aryl or substituted aryl; b and d are each an integer of 0 to 2; c is an integer of 0 to 6; and h, h1, h2 and k are independently an integer from 1 to 6; provided that at least one of R, $R^1$, $R^3$ and $R^5$ is not hydrogen.

In one embodiment, R is $(C_1-C_4)$alkyl, benzyl, hydroxybenzyl, phenethyl or phenyl, and more preferably methyl, ethyl, iso-butyl, tert-butyl or phenyl. Suitable hydrolyzable groups for Y include, but are not limited to, halo, $(C_1-C_6)$alkoxy, acyloxy, and preferably chloro and $(C_1-C_2)$alkoxy. Suitable organosilanes of formula (I) include, but are not limited to, methyl trimethoxysilane, methyl triethoxysilane, phenyl trimethoxysilane, phenyl triethoxysilane, tolyl trimethoxysilane, tolyl triethoxysilane, propyl tripropoxysilane, iso-propyl triethoxysilane, iso-propyl tripropoxysilane, ethyl trimethoxysilane, ethyl triethoxysilane, iso-butyl triethoxysilane, iso-butyl trimethoxysilane, tert-butyl triethoxysilane, tert-butyl trimethoxysilane, cyclohexyl trimethoxysilane, cyclohexyl triethoxysilane, benzyl trimethoxysilane, benzyl triethoxysilane, phenethyl trimethoxysilane, hydroxybenzyl trimethoxysilane, hydroxyphenylethyl trimethoxysilane and hydroxyphenylethyl triethoxysilane.

Organosilanes of formula (II) preferably include those wherein $R^1$ and $R^5$ are independently $(C_1-C_4)$alkyl, benzyl, hydroxybenzyl, phenethyl or phenyl. Preferably $R^1$ and $R^5$ are methyl, ethyl, tert-butyl, iso-butyl and phenyl. In one embodiment, $R^3$ is $(C_1-C_{10})$alkyl, —$(CH_2)_h$—, arylene, arylene ether and —$(CH_2)_{h1}$-E-$(CH_2)_{h2}$. Suitable compounds of formula (II) include, but are not limited to, those wherein $R^3$ is methylene, ethylene, propylene, butylene, hexylene, norbornylene, cycloheylene, phenylene, phenylene ether, naphthylene and —$CH_2$—$C_6H_4$—$CH_2$—. In a further embodiment, c is 1 to 4.

Suitable organosilanes of formula (II) include, but are not limited to, bis(trimethoxysilyl)methane, bis(triethoxysilyl)methane, bis(triphenoxysilyl)methane, bis(dimethoxymethylsilyl)methane, bis(diethoxymethyl-silyl)methane, bis(dimethoxyphenylsilyl)methane, bis(diethoxyphenylsilyl) methane, bis(methoxydimethylsilyl)methane, bis (ethoxydimethylsilyl)methane, bis(methoxy-diphenylsilyl) methane, bis(ethoxydiphenylsilyl)methane, bis (trimethoxysilyl)ethane, bis(triethoxysilyl)ethane, bis (triphenoxysilyl)ethane, bis(dimethoxymethylsilyl)ethane, bis(diethoxymethylsilyl)ethane, bis(dimethoxyphenylsilyl) ethane, bis(diethoxyphenyl-silyl)ethane, bis(methoxydimethylsilyl)ethane, bis(ethoxydimethylsilyl)ethane, bis (methoxy-diphenylsilyl)ethane, bis(ethoxydiphenylsilyl) ethane, 1,3-bis(trimethoxysilyl))propane, 1,3-bis (triethoxysilyl)propane, 1,3-bis(triphenoxysilyl)propane, 1,3-bis(dimethoxy-methylsilyl)propane, 1,3-bis(diethoxymethylsilyl)propane, 1,3-bis(dimethoxyphenyl-silyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl)propane.

Suitable organic polysilica materials include, but are not limited to, silsesquioxanes, partially condensed halosilanes or alkoxysilanes such as partially condensed by controlled hydrolysis tetraethoxysilane having number average molecular weight of 500 to 20,000, organically modified silicates having the composition $RSiO_3$, $O_3SiRSiO_3$, $R_2SiO_2$ and $O_2SiR_3SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes; aryl silsesquioxanes; alkyl/aryl silsesquioxane mixtures; and mixtures of alkyl silsesquioxanes. Silsesquioxane materials include homopolymers of silsesquioxanes, copolymers of silsesquioxanes or mixtures thereof. Such materials are generally commercially available or may be prepared by known methods.

Such organic polysilica materials may contain a wide variety of other monomers in addition to the silicon-containing monomers described above. For example, the organic polysilica materials may further comprise a second cross-linking agent, and carbosilane moieties.

Suitable second cross-linking agents may be any known cross-linkers for silicon-containing materials. Typical second cross-linking agents include silanes of formula (III) $M''(OR^{11})_n$ wherein M is aluminum, titanium, zirconium, hafnium, silicon, magnesium, or boron; $R^{11}$ is $(C_1-C_6)$alkyl, acyl, or $Si(OR^{12})_3$; $R^{12}$ is $(C_1-C_6)$alkyl or acyl; and n is the valence of M. In one embodiment, $R^{11}$ is methyl, ethyl, propyl or butyl. In another embodiment, M is aluminum, titanium, zirconium, hafnium or silicon. It will be appreciated by those skilled in the art that a combination of such second cross-linkers may be used. The ratio of the mixture of silanes of formulae (I) and (II) to such second cross-linking agents organosilanes is typically from 99:1 to 1:99, preferably from 95:5 to 5:95, more preferably from 90:10 to 10:90.

Carbosilane moieties refer to moieties having a $(Si-C)_x$ structure, such as $(Si-A)_x$ structures wherein A is a substituted or unsubstituted alkylene or arylene, such as $SiR_3CH_2-$, $-SiR_2CH_2-$, $=SiRCH_2-$, and $-SiCH_2-$, where R is usually hydrogen but may be any organic or inorganic radical. Suitable inorganic radicals include organosilicon, siloxyl, or silanyl moieties. These carbosilane moieties are typically connected "head-to-tail", i.e. having Si—C—Si bonds, in such a manner that a complex, branched structure results. Particularly useful carbosilane moieties are those having the repeat units $(SiH_xCH_2)$ and $(SiH_{y-1}(CH=CH_2)CH_2)$, where x=0 to 3 and y=1 to 3. These repeat units may be present in the organic polysilica resins in any number from 1 to 100,000, and preferably from 1 to 10,000. Suitable carbosilane precursors are those disclosed in U.S. Pat. No. 5,153,295 (Whitmarsh et al.) and U.S. Pat. No. 6,395,649 (Wu).

The organic polysilica partial condensates may be prepared by reacting one or more tri- or di-functional organo silanes such as those of formula I, one or more silicon-containing cross-linking agents such as those of formula II, and typically water, for a period of time sufficient to hydrolyze (or partially condense) the silanes to form a partial condensate having the desired weight average molecular weight. Typically, the reaction temperature is 78-80° C. due to the boiling point of ethanol. The amount of water is typically from 0.1 to 2.0 mole equivalents, more typically from 0.25 to 1.75 mole equivalents, and even more typically from 0.75 to 1.5 mole equivalents. An acidic or basic catalyst is typically used. Suitable acids and bases include strong acids and strong bases such as hydrochloric acid and tetramethylammonium hydroxide, respectively, weak acids such as acetic acid or weak bases such triethyl amine and/or ammonium hydroxide, respectively. Typically strong acid catalyst like hydrochloric acid is used to catalyze the hydrolysis and condensation reaction of the silanes. The silanes and water are typically reacted from 0.5 to 48 hours, although longer or shorter times may be used. Particularly suitable reaction times are from 1 to 24 hours. The mole ratios of the silanes may vary over a wide range. The mole ratio of the one or more silanes of formula (I) to the one or more silanes of formula (II) is from 99:1 to 1:99, particularly from 95:5 to 5:95, more particularly from 90:10 to 10:90, and still more particularly from 80:20 to 20:80.

Suitable organic polysilica partial condensates may have a wide range of molecular weights. Typically, the partial condensates have a weight average molecular weight of <500,000 including ≤20,000, although higher molecular weights may be used. More typically, the weight average molecular weight is ≤15,000, still more typically ≤10,000, and most typically ≤5,000.

Following formation of the organic polysilica partial condensates, and after optionally removing the acidic catalyst, a stabilizing agent may be optionally added to the partial condensates. Such stabilizing agents are preferably organic acids. Any organic acid having at least 2 carbons and having an acid dissociation constant ("pKa") of 1 to 4 at 25° C. is suitable. Preferred organic acids have a pKa of 1.1 to 3.9, and more preferably 1.2 to 3.5. Organic acids capable of functioning as chelating agents are preferred. Such chelating organic acids include polycarboxylic acids such as di-, tri-, tetra- and higher carboxylic acids, and carboxylic acids substituted with one or more of hydroxyls, ethers, ketones, aldehydes, amine, amides, imines, thiols. Preferred chelating organic acids are polycarboxylic acids and hydroxy-substituted carboxylic acids. The term "hydroxy-substituted carboxylic acids" includes hydroxy-substituted polycarboxylic acids. Suitable organic acids include, but are not limited to: oxalic acid, malonic acid, methylmalonic acid, dimethylmalonic acid, maleic acid, malic acid, citramalic acid, tartaric acid, phthalic acid, citric acid, glutaric acid, glycolic acid, lactic acid, pyruvic acid, oxalacetic acid, ketoglutaric acid, salicylic acid and acetoacetic acid. Preferred organic acids are oxalic acid, malonic acid, dimethylmalonic acid, citric acid and lactic acid, and more preferably malonic acid.

Mixtures of organic acids may be advantageously used in the present invention. Those skilled in the art will realize that polycarboxylic acids have a pKa value for each carboxylic acid moiety in the compound. Only one of the pKa values in such polycarboxylic acids needs to be within the range of 1 to 4 at 25° C. for the organic acid to be suitable for use in the present invention. Such stabilizing agents are typically used in an amount of 1 to 10,000 ppm and preferably from 10 to 1000 ppm. Such stabilizing agents function to retard further condensation of the material and extend the shelf-life of the partial condensates.

Suitable zirconia and hafnia materials including $HfO_2$ and $ZrO_2$ are commercially available from vendors such as from Alfa as well as Nyacol Products (Ashland Mass.).

Particle Component

In a further one aspect, preferred coating compositions comprise a plurality of discrete particles, e.g. where a plurality of the particles have a mean particle size (e.g., diameter of substantially spherical particles) of 1000 angstroms or less.

Such particles may be composed or a variety of materials, including both organic and inorganic compositions, with inorganic (which includes inorganic materials that are surface-modified with organic or inorganic groups) being generally preferred. In this aspect of the invention, preferred particles may comprise silicon, antimony, aluminum, yttrium, cerium, lanthanum, tin, titanium, zirconium, hafnium, indium or zinc compounds. Particularly preferred particles may comprise silicon, zirconium and/or hafnium. Especially preferred particles may comprise colloidal materials, including colloidal inorganic compositions such as colloidal silica, hafnia and/or zirconia. Such materials may be readily prepared and are commercially available from vendors such as Nissan Chemicals. As referred to herein, references to "colloid", "colloidal" or other similar term indicate a particle of a coating composition of the invention that has a dimensional size (e.g. diameter) of less than 1 micron, and typically has a dimensional size (e.g. diameter) of from 1 nm to 1 micron.

Generally preferred particle components will be substantially non-aggregated, e.g. where more than 30, 40, 50, 60, 70, 80 or 90 weight percent of the total particles of a composition can be observed in aqueous composition as individual, rather than aggregated into groups of two or more particles. Such determination can be made by diluting particles into water at 1 ppm solids and observing a sample under a microscope. While aggregated particles also can be useful, for at least certain applications, a composition have such as substantially non-aggregated particle component may be preferred.

Particularly preferred particle components include colloidal silica both of monodisperse sizes and mixed sized as well as polyhedral oligomeric silsesquioxane (POSS). Also preferred are other colloidal materials that may not contain silica, but may contain other materials such as one or more antimony, aluminum, yttrium, cerium, lanthanum, tin, titanium, zirconium, hafnium, indium and/or zinc compounds.

Monodisperse particles can be particularly preferred for many applications, particularly for use of the coating composition as a top antireflective composition applied over a photoresist. Without being bound by any theory, such monodisperse (substantially same size) particles such as monodisperse colloidal silica can form an efficiently packed coating layer structure that can provide a substantial volume of interstitial spacing between the particles. Such spacing can provide a reduced refractive index for the coating layer.

It also may be desirable to employ a mixture of nanoparticles and microparticles in a coating composition to provide further stablization to the composition. Use of a mixture of nanoparticles and microparticles may be done as disclosed in U.S. Patent Publication 2003/0091647. For such compositions, preferred microparticles may have mean particle diameters of 0.01 µm to 100 µm, more typically 0.05 µm to 10 µm; and nanoparticles may have an effective diameter of 1 nm to 300 nm, with a ratio of the effective diameter of nanoparticles to the effective diameter of microparticles being at least 1 nm to 3 nm, and more suitably 1 nm to 10 nm.

As discussed above, it may be desirable to functionalize a particle such as a silica particle. For instance, a silica particle can be modified such as surface modified by a variety of material including e.g. one or more silane monomers, including organosilane monomers such as monomers having 1 or more Si atoms e.g. 1 to 3 Si atoms and 1 to 20 carbon atoms. See the examples which follow for particularly preferred surface modification of particles of overcoating composition of the invention.

Optional Additives

Preferred coating compositions of the invention suitably may optionally comprise one or more materials in addition to the above discussed particle component and/or component that may comprises one or more silicon, antimony, aluminum, yttrium, cerium, lanthanum, tin, titanium, zirconium, hafnium, indium or zinc compounds.

Preferred optional coating composition components include one or more resins. A wide variety of resin components may be suitably employed. For example, suitable resins include those that polar functional groups on one or more repeat units, particularly functional groups that can impart water solubility or dispersiblity such as hydroxy, carboxy (—COOH), and sulfonyl ($>SO_2$). Exemplary resin additives include poly(vinylalcohols), polyethylene oxide (PEO), polypropylene oxide (PPO), polytetrahydrofuran, PEO-PPO (co, block, triblock polymers), glycerol-tri-(PEO-PPO), polyacrylic acid), poly(methacrylic acid), poly(methyl vinyl ether), poly(vinyl pyrrolidone), poly(allylamine), poly(ethyleneimine), poly(acrylamide), poly(maleic acid), poly(vinylacetate), urethane resins such as poly(urethane diol), cellulose-based resins such as hydroxypropyl cellulose and hydroxyethyl cellulose, as well as copolymers of these materials. Also, the resins may be suitably in salt form, e.g. used in ammonium salt form.

Suitable resin additives are commercially available.

Coating compositions of the invention also may comprise one or more chromophore groups that can significantly absorb radiation used to image an underlying photoresist composition layer. Typically suitable chromophore groups are aromatic groups, particularly carbocyclic aryl groups such as phenyl, naphthyl, and anthracenyl. Such groups may be a substituent of the above discussed resin or particle component, or may be a substituent of another polymeric or non-polymeric additive of a coating composition. For coating compositions employed with undercoated photoresist composition that are imaged with 248 nm radiation, preferred chromophore groups include anthracenyl and naphthyl. For coating compositions employed with undercoated photoresist composition that are imaged with 248 nm radiation, preferred chromophore groups include phenyl. In certain preferred embodiments, however, the coating compositions of the invention will not contain such chromophore groups including such carbocyclic aryl or other aromatic chromophore groups.

A further preferred optional additive is one or more surfactants, which can promote formation of a substantially uniform coating layer of the overcoated composition. A variety of surfactants may be employed. Suitable surfactants may exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-102, X-45, X-15 and alcohol ethoxylates such as BRIJ® 56 ($C_{16}H_{33}$ $(OCH_2CH_2)_{10}OH)$(IC1), BRIJ® 58 ($C_{16}H_{33}$ $(OCH_2CH_2)$ 20OH)(IC1). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following Formulae IV and V:

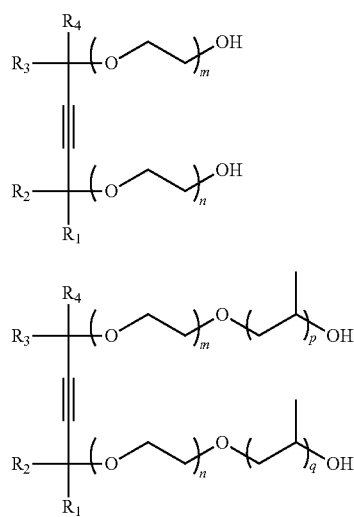

wherein in those Formulae IV and V $R_1$ and $R_4$ are a straight or a branched alkyl chain suitably having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

For at least certain applications, coating compositions that contain one or more zwitterion surfactants also will be suitable.

Additional optional additives for the coating compositions may include stabilizing agents which can promote enhanced shelf life of the prepared composition. Suitable stabilizing agents may include poly-acids such as diacids and triacids e.g. citric acid, malonic acid. Additional stabilizing agents that may be suitable for coating compositions of the invention may be a peroxide materials such as reported in U.S. Pat. No. 6,750,257 and Japanese Patent JP200204568681, which discloses use of hydrogen peroxide as a stabilizing agent in an amount of 5 to 100 ppm in a colloidal silica composition.

A yet further optional additive for coating compositions of the invention will be one or more acids and/or acid generator compounds. As discussed above, inclusion of an acid source in a coating composition of the invention can provide enhanced resolution of an image patterned in an underlying photoresist layer, including to control the profile of developed photoresist image. As shown in Example 14 which follows, it has been found that the absence of an acid in an overcoated coating composition of the invention can result in undesired T-topping of developed resist image whereas the inclusion of an acid source in an overcoated coating composition of the invention can provide a desired rounded profile of the imaged resist layer.

Suitable acid additives can be both organic and inorganic acids. Exemplary acid additives include e.g. nitric acid, sulfuric acid, trichloroacetic acid, trifluoroacetic acid, oxalic acid, maleic acid, malonic acid, succinic acid, maleic acid, citric acid, tartaric acid, para toluene sulfonic acid, trifluoromethylbenzenesulfonic acid, camphor sulfonic acid, and trifluoromethane sulfonic acid.

Suitable amounts of one or more acids in a coating composition of the invention may vary within a wide range and may be readily optimized for any particular composition by simple testing (e.g. by evaluating resolution of undercoated imaged photoresist) and consideration of factors such as acid pKa, mobility and size. Suitable acid loading levels may include less than 5 weight percent of the fluid coating composition, more preferably less than 1 weight percent of the fluid coating composition, and even more preferably less than 0.5% by weight of fluid coating composition, such as within a range of from 0.1 to 0.4 weight percent of the fluid coating composition.

Suitable acid generator compounds include photoacid generator compounds and thermal acid generator compounds. Exemplary thermal acid generator compounds include both ionic as well as substantially neutral thermal acid generators, e.g. an ammonium arenesulfonate salt. Suitable thermal acid generator compounds are commercially available such as from King Industries. Suitable photoacid generator compounds to employ in a coating composition include onium salts, particularly iodonium and sulfonium compounds such as those discussed below with respect to photoresists. Exemplary acid generator compounds that may be employed in a coating composition of the invention include triphenyl sulfonium camphor sulfonate, triphenyl sulfonium trifluormethane sulfonate, triphenyl sulfonium trifluorooctane sulfonate, triphenyl sulfonium trifluorobutane sulfonate, triphenyl sulfonium trifluormethylbenzene sulfonate, triphenyl sulfonium para-toluene sulfonate, ammonium camphor sulfonate, ammonium trifluormethane sulfonate, ammonium trifluorooctane sulfonate, ammoniumtrifluorobutane sulfonate, ammonium trifluormethylbenzene sulfonate, and ammonium para-toluene sulfonate. Other photoacid generator compounds identified below for use in connection with photoresists can be employed in an overcoated coating composition of the invention. If used, one or more acid generators may be suitably present in a coating composition in a concentration from 0.1 to 10 percent by weight of the total of the dry components of the coating composition (all components except solvent carrier), more preferably 0.1 to 2 percent by weight of the total dry components.

Also, as discussed above, it has been found that addition of one or more acid compounds and/or one or more hetero-substituted polymers can reduce or effectively avoid undesired residues remaining on a substrate surface following lithographic processing of a photoresist overcoated with a composition of the invention. Preferred acid additives are aromatic and non-aromatic compound that comprise one or more carboxylic acid groups, particularly compounds having molecular weights of less than 1500 or 1000 such as malonic acid and other acids discussed above. Preferred hetero-substituted polymers include polymers having hydroxyl groups including a poly(vinyl alcohol). Such acid and polymer additives are suitably employed in amounts of 0.1 weight percent to 10 weight percent based on total weight of a coating composition, more typically from about 1 weight percent to 5 weight percent based on total weight of a coating composition. It also can be suitable to employ such acid and polymer additive in combination in a single composition.

Formulation of an Overcoated Coating Composition

Coating compositions of the invention may be readily prepared by admixing the above discussed particle component and/or component that comprises one or more silicon, antimony, aluminum, yttrium, cerium, lanthanum, tin, titanium, zirconium, hafnium, indium or zinc compounds in an aqueous composition optionally together with one or more further additives as discussed above, i.e. one or more resins, one or more surfactants, one or more stabilizing agents, and/or one or more acids and/or acid generator compounds. It should be understood that coating compositions may suitably or even preferably include both aspects of the invention, i.e. a coating composition may comprise both 1) component that comprises one or more silicon, antimony, aluminum, yttrium, cerium, lanthanum, tin, titanium, zirconium, hafnium, indium or zinc compounds and 2) particle component, or a coating composition may comprise particles that have silicon, antimony, aluminum, yttrium, cerium, lanthanum, tin, titanium, zirconium, hafnium, indium and/or zinc content.

Coating compositions may be formulated in a variety of concentrations, with aqueous compositions comprising from 0.1 to 30 weight percent total solids (all components except water and any organic solvent carriers) based on total composition weight being suitable, and more preferred are aqueous compositions that comprise from 1 to 10 weight percent total solids, or even 1 to 3, 4 or 5 weight percent total solids, based on total composition weight.

If a resin composition additive is employed, the one or more resins are preferably used in a lower weight percent amount than the particle component and/or component that comprises one or more silicon, antimony, aluminum, yttrium, cerium, lanthanum, tin, titanium, zirconium, hafnium, indium or zinc compounds. For example, the resin component may be suitably employed in an amount that is 80, 50, 40, 30, 20, 10 or 5 weight percent relative to the weight of the particle component and/or component that comprises one or more silicon, antimony, aluminum, yttrium, cerium, lanthanum, tin, titanium, zirconium, hafnium, indium or zinc compounds present in the coating composition. However, greater relative amounts of the resin components also may be employed if desired.

Optional surfactants and stabilizing agents suitably may be each employed in relatively small amounts, e.g. from 0.001 to 5 weight percent, based on total weight of the coating compositions. Surfactants may be suitably employed in relatively low amounts e.g. 500 ppm or less based on the total fluid coating composition.

Photoresists

A wide variety of photoresist compositions may be used in combination with coating compositions and processes of the invention.

Preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of the invention. Acetal photoacid-labile groups also will be preferred.

Suitable photoresists may contain resin and photoactive components. Preferably the resin has functional groups that impart alkaline aqueous develop ability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from 2,000 to 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

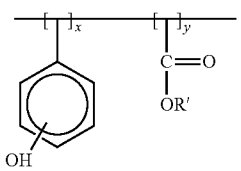

wherein the hydroxyl group be present at either the ortho, meta or para positions throughout the copolymer, and R' is substituted or unsubstituted alkyl having 1 to 18 carbon atoms, more typically 1 to 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from 8,000 to 50,000, more preferably 15,000 to 30,000 with a molecular weight distribution of 3 or less, more preferably a molecular weight distribution of 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from 8,000 to 50,000, and a molecular weight distribution of 3 or less.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

For imaging at sub-200 nm wavelengths such as 193 nm, preferably a photoresist is employed that contains one or more polymers that are substantially, essentially or completely free of phenyl or other aromatic groups. For example, for sub-200 nm imaging, preferred photoresist polymers contain less than 5 mole percent aromatic groups, more preferably less than 1 or 2 mole percent aromatic groups, more preferably less than 0.1, 0.02, 0.04 and 0.08 mole percent aromatic groups and still more preferably less than 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a photoacid generator compound (PAG) to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride.

Preferred negative-acting compositions of the invention comprise a mixture of materials that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

As also discussed above, overcoated coating compositions of the invention suitably may be employed with photoresists imaged with longer wavelength radiation, such as imaging radiation having a wavelength of greater than 300 nm and 400 nm, including 365 nm (I-line) and 436 nm(G-line). For such higher wavelength imaging, preferred are photoresists that comprise a phenolic resin such as a novolak resin and a diazonaphthoquinone photoactive compound.

Photoresists of the invention also may contain other materials. For example, other optional additives include actinic and contrast dyes, anti-striation agents, plasticizers, speed enhancers, sensitizers (e.g. for use of a PAG at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, e.g. a caprolactam, which can enhance resolution of a developed resist relief image. The added base is suitably used in relatively small amounts, e.g. 1 to 10 percent by weight relative to the PAG, more typically 1 to 5 weight percent. Other suitable basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, and 2-(4-aminophenyl)-2-(4-hydroxyphenyl)propane.

The resin component of resists useful in accordance with the invention are typically used in an amount sufficient to render an exposed coating layer of the resist developable such as with an aqueous alkaline solution. More particularly, a resin component will suitably comprise 50 to 90 weight percent of total solids of the resist. The photoactive component should be present in an amount sufficient to enable generation of a latent image in a coating layer of the resist. More specifically, the photoactive component will suitably be present in an amount of from 1 to 40 weight percent of total solids of a resist. Typically, lesser amounts of the photoactive component will be suitable for chemically amplified resists.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

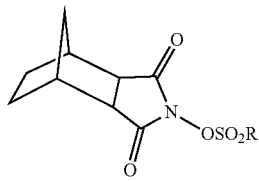

wherein R is camphor, adamantane, alkyl (e.g. $C_{1-12}$ alkyl) and perfluoroalkyl such as perfluoro($C_{1-12}$alkyl), particularly perfluorooctanesulfonate, and perfluorononanesulfonate. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

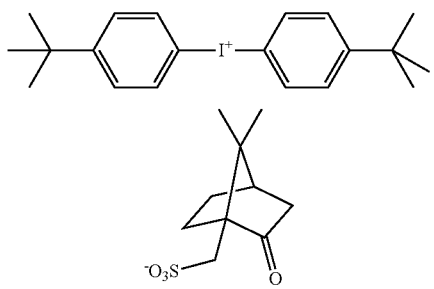

1

-continued

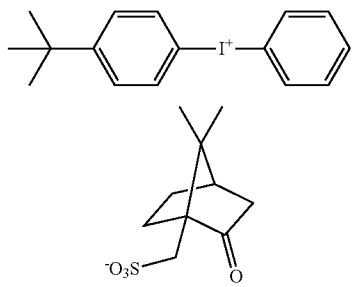

2

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, and perfluorobutanesulfonate.

Other known PAGS also may be employed in photoresists used in accordance with the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. 0.03 to 5 percent by weight relative to the total solids.

Photoresists used in accordance with the invention also may contain other optional materials. For example, other optional photoresist additives include anti-striation agents, plasticizers, speed enhancers, etc. Such optional additives typically will be present in minor concentrations in a photoresist composition except for fillers and dyes which may be present in relatively large concentrations, e.g., in amounts of from 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Lithographic Processing

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components as liquid crystal substrates and MEMS substrate. Aluminum, aluminum oxide, gallium arsenide, ceramic, quartz, copper, indium tin oxide, nickel-iron, In—P, Si—Ge, Si—C, silicon nitride, boron nitride, glass substrates are also suitably employed.

Following coating of the photoresist onto a surface, it may be dried by heating to remove the solvent until preferably the photoresist coating is tack free.

As discussed, a coating composition of the invention is suitably applied above or over a photoresist composition layer by any of a variety of methods, including dip coating, roller coating, slot coating, spray coating, chemical vapor deposition or preferably spin coating.

The overcoated composition layer may be dried by thermal treatment if desired, but such a bake step is not necessary. It has been found that good results can be achieved with coating layers that are spun-dried.

As discussed above, preferred applied coating compositions of the invention can be removed including after such spin-drying such as with an aqueous composition include an alkaline developer composition or a fluoride salt composition. In the case of an alkaline developer, it is preferred that a metal free hydroxide salt is used. Typical examples of metal free salts, include but are not limited to tetramethylammonium, tetraethylammonium, tetrabutylammonium or tetraalkylammonium hydroxide. The concentration of the aqueous based developer is typically 0.26N but can increased or decreased depending on the need to control dissolution rate of the photoresist film. Typical fluoride salts include but are not limited to ammonium bifluoride, ammonium fluoride, tetrmethylammonium fluoride, or tetraalkylammonium fluoride. Typical concentrations of the fluoride salts are less than 1% and preferably less than 0.5% and more preferably less than 0.1%.

The overcoated composition layer may be applied at a variety of dried (spun-dry) layer thicknesses. If the composition is being employed as a top antireflective layer with an undercoated resist imaged at 193 nm, preferred top dried layer thicknesses include from 300 to 400 angstroms with a 350 angstrom layer thickness being particularly preferred. If the composition is being employed as a top antireflective layer with an undercoated resist imaged at 248 nm, preferred top layer dried thicknesses include from 400 to 500 angstroms with a 470 angstrom layer thickness being particularly preferred. If the composition is being employed as a top antireflective layer with an undercoated resist imaged at 365 nm, preferred top layer dried thicknesses include from 650 to 750 angstroms with a 700 angstrom layer thickness being particularly preferred.

The photoresist composition layer with overcoated coating composition layer is then suitably patterned exposed to activating radiation with the exposure energy typically ranging from 1 to 300 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-300 and sub-200 nm exposure wavelength, with 248 nm and 193 nm being particularly preferred exposure wavelengths as well as EUV and 157 nm. Also suitable are photoresists that are imaged at higher wavelengths such as 365 nm and 436 nm.

The photoresist composition layer with overcoated composition layer also may be suitably exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

Following exposure, the coated substrate is preferably baked at temperatures ranging from 70° C. to 160° C.

As discussed above, following exposure, and before and/or after development, the coated substrate may be washed, e.g. with an aqueous composition that may contain one or more additives such as a fluoride compound. An aqueous ammonium fluoride composition can be useful. The wash solution may be suitably applied by spin-coating, or by other means. See, for instance, the procedure of Example 11, which follows.

Thereafter, the photoresist layer with overcoated coating composition layer is developed, preferably by treatment with an aqueous based developer such as quaternary ammonium hydroxide solutions such as a tetra-alkyl ammonium hydroxide solution; various amine solutions preferably a 0.26 N tetramethylammonium hydroxide. In general, development is in accordance with procedures recognized in the art.

Following development of the photoresist coating over the substrate, the developed substrate may be selectively processed on those areas bared of resist, for example ion implantation or by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

EXAMPLE 1

Composition Preparation and Coating

A coating composition of the invention was prepared by admixing the following components in the following amounts based on total composition weight:

1. 0.250 weight % of poly(vinyl alcohol)
2. 2.250 weight % colloidal silica (having diameter <20 nm)
3. 97.500 weight % water This composition was spin-coated onto a dried photoresist layer that had been applied to a silicon wafer substrate.

EXAMPLE 2

Composition Preparation and Coating

A further coating composition of the invention was prepared by admixing the following components in the following amounts based on total composition weight:
1. 0.500 weight % poly(vinyl alcohol)
2. 2.000 weight % colloidal silica (having diameter <20 nm)
3. 97.500 weight % water This composition was spin-coated onto a dried photoresist layer that had been applied to a silicon wafer substrate. The coating quality was good was less than one percent coating layer thickness variation across the applied coating layer.

EXAMPLE 3

Composition Preparation and Lithographic Processing

A further coating composition of the invention was prepared by admixing the following components in the following amounts based on total composition weight:
1. 0.469 weight % poly(acrylic acid)
2. 2.211 weight % colloidal silica (having diameter <20 nm)
3. 97.320 weight % water The solution had a pH of 6.5. This composition was spin-coated onto a dried photoresist layer that had been applied to a silicon wafer substrate. This sample had excellent coat quality. The refractive index of the film was 1.315 at 673 nm wavelength.

EXAMPLE 4

Composition Preparation and Lithographic Processing

A further coating composition of the invention was prepared by admixing the following components in the following amounts based on total composition weight:
1. 0.17 weight % Tamol 963 Dispersant (35%)
2. 2.21 weight % colloidal silica (having diameter <20 nm)
4. 97.62 weight % water The solution had a pH of 6.5. This composition was spin-coated onto a dried photoresist layer that had been applied to a silicon wafer substrate. This sample had excellent coat quality. The refractive index of the film was 1.314 at 673 nm wavelength.

EXAMPLE 5

Composition Preparation and Lithographic Processing

A further coating composition of the invention was prepared by admixing the following components in the following amounts based on total composition weight:

1. 0.24 weight % polyacrylic acid
2. 2.21 weight % colloidal silica
3. 0.001 weight % Surfynol 440 Surfactant (100 ppm)
4. 97.62 weight % water The solution had a pH of 6.5. This composition was spin-coated onto a dried photoresist layer that had been applied to a silicon wafer substrate. This sample had excellent coat quality. The refractive index of the film was 1.317 at 673 nm wavelength.

TABLE 1

Alternate surfactants and surface modification agents were evaluated by substitution for Surfynol 440 in Example 5. The solution stability and coating quality were summarized below.

| Tradename | Class | Amount weight % | Type | Solution Stability | Coating Quality |
|---|---|---|---|---|---|
| Dynol 604 | Ethyloxylate acetylenic diol | 0.01 | Nonionic | Unstable | Poor |
| Pluronic 25R2 | Polypropylene/ethylene oxide polymer | 0.01 | Nonionic | Stable | Good |
| Polyfox 151N | Fluorinated oligomer | 0.02 | Nonionic | Unstable | Poor |
| Polyfox 156A | Fluorinated oligomer | 0.10 | Anionic | Stable | Good |
| Silwet 7604 | Siloxane-PEO | 0.01 | Nonionic | Unstable | Poor |
|  | Ethoxylated phenol | 0.01 | Nonionic | Stable | Good |
|  | Polyethyleneglycol-propyltriethoxysilane | 0.01 | Nonionic | Stable | Good |
| Surfynol 465 | Ethyloxylate acetylenic diol | 0.01 | Nonionic | Stable | Good |
| Surfynol 485 | Ethyloxylate acetylenic diol | 0.01 | Nonionic | Stable | Good |

Solution is stable if no precipitate was observed upon standing at room temperature for 24 hours. Good coating quality is defined as no haze or phase separation observed upon coating of a film on a substrate.

EXAMPLE 6

Composition Preparation and Coating

A further coating composition of the invention is prepared by admixing the following components in the following amounts based on total composition weight:
1. 0.17 weight % Tamol 963 Dispersant
2. 2.21 weight % 15 nm colloidal silica
3. 0.001 weight % Envirogen AE-01 Surfactant (an alkyl diacid) (100 ppm)
4. 97.62 weight % water This composition is spin-coated onto a dried photoresist layer that has been applied to a silicon wafer substrate.

EXAMPLE 7 pH Adjustment to Improve Composition Stability

A further coating composition of the invention was prepared by admixing the following components in the following amounts based on total composition weight:
1. 0.24 weight % polyacrylic acid
2. 2.21 weight % 15 nm colloidal silica
3. 2.0 weight % nitric acid
4. 0.03 weight % non-ionic surfactant
5. 97.62 weight % water The solution had a pH of 2.5. This composition was spin-coated onto a dried photoresist layer that had been applied to a silicon wafer substrate. This sample had excellent coat quality. The refractive index of the film was 1.317 at 673 nm wavelength.

TABLE 2

Alternate inorganic and organic acids and bases were evaluated by substitution for nitric acid in Example 7. The loading level, acid solubility, solution stability and pH are listed below.

| Acid | Type | Amount weight % | Acid Solubility | Solution Stability | pH |
| --- | --- | --- | --- | --- | --- |
| nitric acid | Inorganic acid | 2.0 | Soluble | Stable | 2.5 |
| hydrochloric acid | Inorganic acid | 2.0 | Soluble | — | — |
| acetic acid | Organic carboxylic acid | 2.0 | Soluble | Stable | — |
| oxalic acid | Organic carboxylic acid | 2.0 | Soluble | Stable | — |
| formic acid | Organic carboxylic acid | 2.0 | Soluble | — | — |
| malonic acid | Organic carboxylic acid | 2.0 | Soluble | Stable | — |
| salicylic acid | Organic carboxylic acid/alcohol | 2.0 | Not soluble | — | — |
| citric acid | Organic carboxylic acid/alcohol | 2.0 | Soluble | Stable | — |
| lactic acid | Organic carboxylic acid/alcohol | 4.0 | Soluble | Stable | |
| cyclohexylaminopropanesulfonic acid | Organic sulfonic acid/amine | 1.0 | Soluble | Stable | |
| para toluene sulfonic acid | Organic sulfonic acid | 1.0 | Soluble | Stable | 2.4 |
| trifluoromethylbenzensulfonic acid | Organic sulfonic acid | 0.5 | Soluble | Stable | |
| camphor sulfonic acid | Organic sulfonic acid | 0.05 | Soluble | Stable | |
| perfluorobutane carboxylic acid | Organic carboxylic acid | 1.0 | Soluble | Stable | 2.6 |
| triphenyl sulfonium camphor sulfonate | Photoacid generator | 0.14 | Soluble | Stable | |
| ammonium citrate | Thermal acid generator | 2.0 | Soluble | Stable | |
| ammonium persulfate | Thermal acid generator | 2.0 | Soluble | Stable | |
| ammonium oxylate | Thermal acid generator | 2.0 | Soluble | Stable | |
| ammonium perfluorobutanesulfonate | Thermal acid generator | 2.0 | Soluble | Stable | |
| Ammonium perfluorooctanesulfonate | Thermal acid generator | 2.0 | Soluble | Stable | |
| Ammonium trifluoromethanesulfonate | Thermal acid generator | 2.0 | Soluble | Stable | |
| Ammonium para-toluene sulfonate | Thermal acid generator | 2.0 | Soluble | Stable | |
| Ammonium hydroxide | Inorganic base | 1.0 | Soluble | Stable | 10.3 |
| Tetramethyl ammonium hydroxide | Inorganic base | 0.04 | Soluble | Stable | 4.0 |
| Ammonium bicarbonate | Inorganic base | 1.0 | Soluble | Stable | 7.2 |

Acid is consider soluble if it dissolves in water within 24 hours.

Solution is stable if no precipitate was observed upon standing at room temperature for 24 hours.

EXAMPLE 8

Composition Preparation and Coating

A coating composition of the invention was prepared by admixing the following components in the following amounts based on total composition weight:
1. 2.250 weight % 15 nm colloidal zirconia (having diameter <20 nm)
2. 97.500 weight % water The solution had a pH<1. This composition was spin-coated onto a silicon wafer substrate. The solution is coated onto a silicon substrate via spin-coating technique. The refractive index of the film was 1.8 at 673 nm wavelength.

EXAMPLE 9

Composition Preparation and Coating

A coating composition of the invention was prepared by admixing the following components in the following amounts based on total composition weight:
1. 1.25 weight % colloidal silica ($SiO_2$ having diameter <20 nm)
2. 1.25 weight % colloidal zirconia ($ZrO_2$ having diameter <20 nm)
3. 97.500 weight % water The solution had a pH<1. The colloidal mixture is stable. The solution is coated onto a silicon substrate via spin-coating technique.

EXAMPLE 10

Composition Preparation and Coating

A coating composition of the invention is prepared by admixing the following components in the following amounts based on total composition weight:
1. 0.5 weight % colloidal indium oxide ($In_2O_3$ having diameter <20 nm)
2. 1.5 weight % colloidal tin oxide ($SnO_2$ having diameter <20 nm)
3. 97.500 weight % water The solution is stable. The solution is coated onto a silicon substrate via spin-coating technique.

TABLE 3

Alternate metal oxides are evaluated by substitution for silicon and zirconium oxide in Example 10. The level of each metal oxide is listed below.

| Oxide 1 | weight % of solids | Oxide 2 | weight % of solids |
|---|---|---|---|
| Silicon oxide (Nyacol) | 75 | Zirconium oxide (Nyacol) | 25 |
| Silicon oxide (Nyacol) | 50 | Hafnium oxide (Nyacol) | 50 |
| Silicon oxide (Nyacol) | 75 | Hafnium oxide | 25 |
| Indium oxide (Nyacol) | 50 | Tin Oxide | 50 |
| Indium oxide (Nyacol) | 75 | Tin Oxide | 25 |
| Antimony oxide (Nyacol) | 15 | Tin Oxide (Nyacol) | 85 |
| Antimony doped Tin oxide (Nyacol) | 100 | | |
| Cerium oxide | 100 | | |
| Zirconium oxide (Yttria stabilized) | 100 | | |
| Titanium dioxide (Silvento) | 100 | | |
| Lanthanum oxide | 100 | | |
| Zinc Oxide | 100 | | |

EXAMPLE 11

Immersion Lithography

A coating composition of Example 1 was spin coated on to silicon wafers having a coating layer of a deblocking-methacrylate based 193 nm positive photoresist had already been deposited. The photoresist was then imaged in an immersion lithography system with patterned radiation having a wavelength of 193 nm.

EXAMPLE 12

Defect Reduction

A 248 nm chemically-amplified positive photoresist was spin coated onto silicon wafers substrate and those coated wafers were soft-baked on a vacuum hotplate to remove solvent.

For one resist-coated wafer, a coating composition of type disclosed in Example 1 was spin coated. For another resist-coated wafer, an overcoating coating composition was not applied.

Both wafers were exposed to patterned 248 nm radiation, post-exposure baked and then developed with an aqueous alkaline developer solution. The wafer that had been coated with the composition of the type disclosed in Example 1 showed fewer post-development defects (discernable residues) than the wafer that had not been coated.

EXAMPLE 13

Alternate Removal Process for Top Composition Coating Layer

A 248 nm chemically-amplified positive photoresist was spin coated onto a silicon wafer substrate and the coated wafer was soft-baked on a vacuum hotplate to remove solvent.

A coating composition of type disclosed in Example 1 was spin coated on top of the photoresist layer.

The wafers was exposed to patterned 248 nm radiation, post-exposure baked and then treated with a 5000 ppm aqueous ammonium fluoride solution to remove the top layer selectively. The resist was then developed normally with an aqueous alkaline developer solution.

EXAMPLE 14

Comparative Evaluation of Acid Additions

Three coating compositions (referred to as Coating Compositions 1, 2 and 3) were prepared of the same formulation as described above in Example 7, except in Coating Composition 1 the nitric acid was omitted, in Coating Composition 2 0.05 weight percent (based on total fluid composition weight) of trifluoromethylbenzene sulfonic acid was used in place of nitric acid, and in Coating Composition 3 0.5 weight percent (based on total fluid composition weight) of trifluoromethylbenzene sulfonic acid was used in place of nitric acid.

A 248 nm chemically-amplified positive photoresist was spin coated onto silicon wafers substrate and those coated wafers were soft-baked on a vacuum hotplate to remove solvent.

Coating Compositions 1, 2 and 3 were spin coated onto separate one resist-coated wafer. The wafers were then were exposed to patterned 248 nm radiation, post-exposure baked and then developed with an aqueous alkaline developer solution.

BRIEF DESCRIPTION OF THE DRAWINGS

The following is a brief description of the drawings.

Scanning electron micrographs of the developed resist images are shown in FIGS. 1 through 3.

EXAMPLE 15

Figure 1:
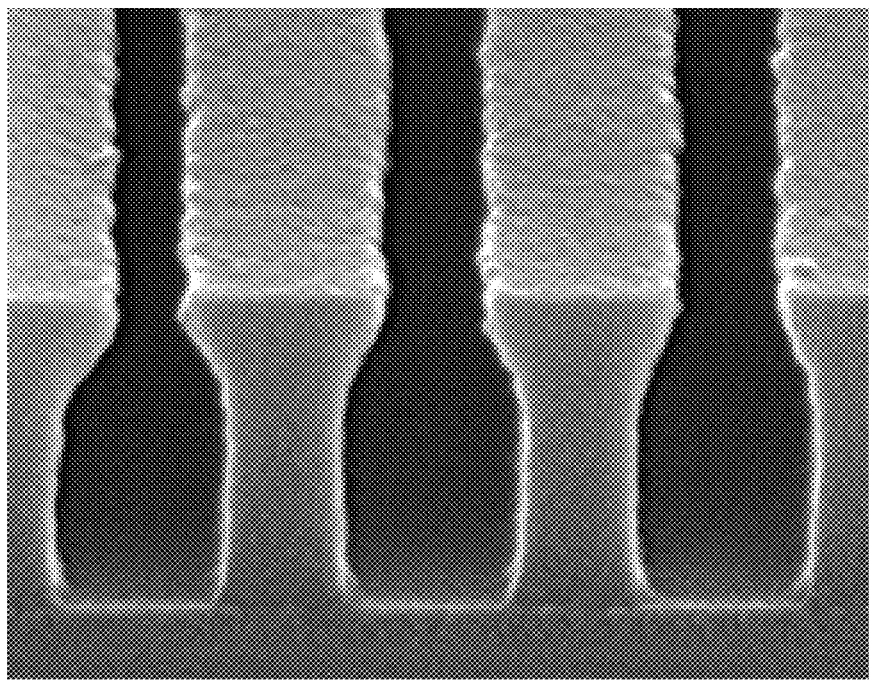
FIG. 1 shows the developed resist image produced from the resist layer overcoated with Coating Composition 1.
Figure 2:
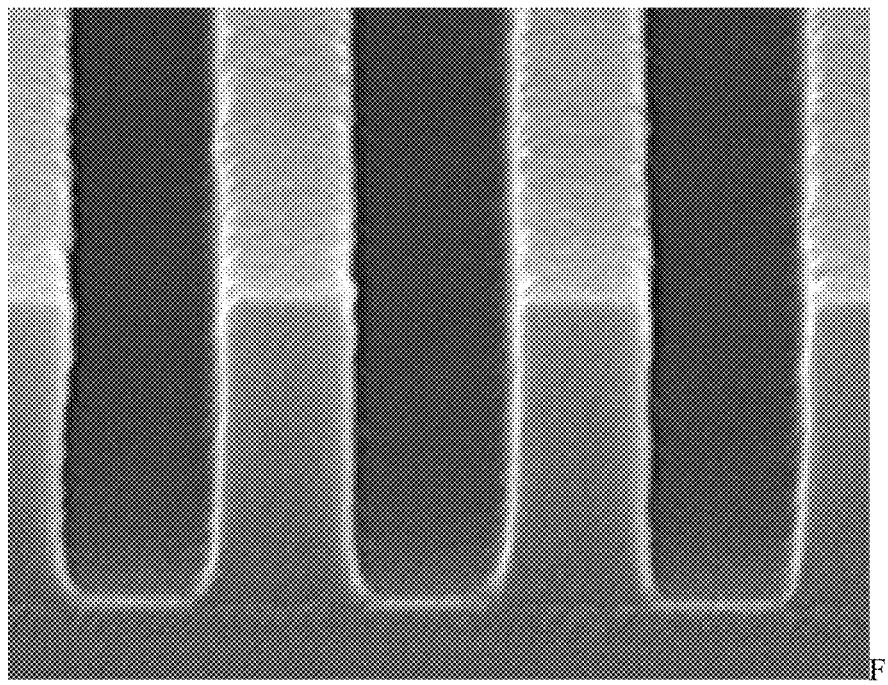
FIG. 2 shows the developed resist image produced from the resist layer overcoated with Coating Composition 2.
Figure 3:
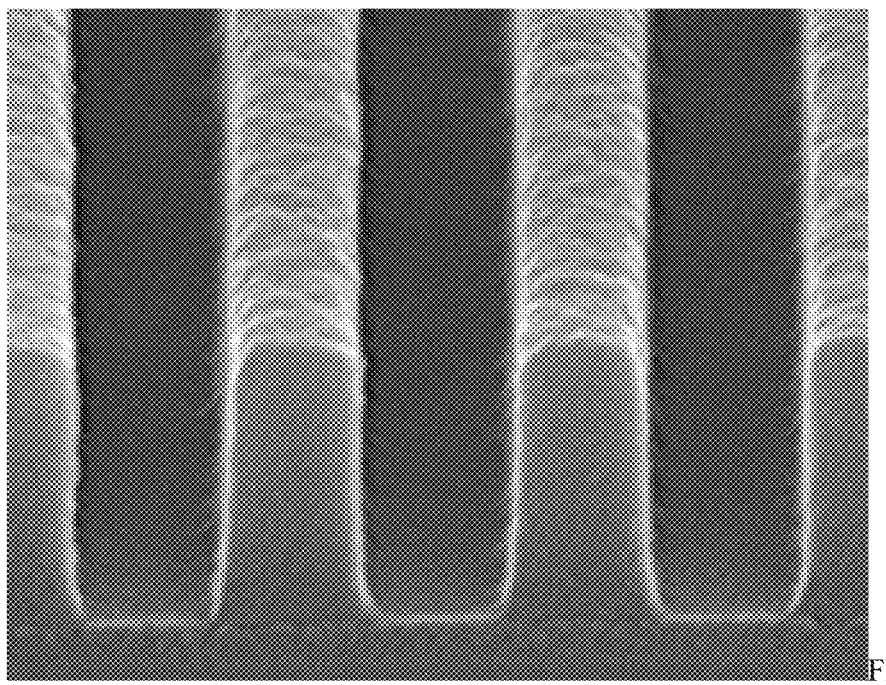
FIG. 3 shows the developed resist image produced from the resist layer overcoated with Coating Composition 3.

Reduced Post Develop Defects with Use of a Carboxylic Acid Additive

A further coating composition of the invention was prepared by admixing the following components in the following amounts based on total composition weight:
0.013 weight % Poly(vinyl alcohol)
0.080 weight % Perfluorobutane sulfonic acid
0.027 weight % Dodecyl benzene sulfonic acid
0.080 weight % Malonic acid
2.650 weight % Colloidal silica having <20 nm mean particle size
2.000 weight % 1-Propanol
95.150 weight % Water This composition ("composition of example") was spin coated onto a dried photoresist layer that had been applied to a silicon wafer substrate. The above stack was then baked at 110° C./60 sec. and then developed for 45 seconds with 0.26N TMAH developer.

A comparable composition ("comparison composition") was prepared an processed as immediately described above, but this comparison composition did not contain malonic acid. Scanning electron micrograph analysis of the processed substrates that had employed the composition of the example and the comparison example showed no bulk residue on substrate surfaces with the composition of the example having the malonic acid additive whereas the comparison composition did show residues.

EXAMPLES 16-33

Additional Compositions with Acid Additives

Additional coating compositions of the invention are prepared corresponding to the composition of Example 15 above, but where the following additives were separately added in the specific weight percent in place of malonic acid.

| Composition of Example No. | Additive Loading and Type | Functionality |
| --- | --- | --- |
| 16 | 5.7% D-Gluconic Acid | Carboxylic acid |
| 17 | 3.0% Malonic Acid | Carboxylic acid |
| 18 | 2.2% Glycolic Acid | Carboxylic acid |
| 19 | 3.9% Malic Acid | Carboxylic acid |
| 20 | 3.4% Succinic Acid | Carboxylic acid |
| 21 | 5.5% Tetrafluorosuccinic Acid | Carboxylic acid |
| 22 | 4.2% Dimethylsuccinate | Methyl ester |
| 23 | 3.0% 2-Hydroxyisobutyric Acid | Carboxylic acid |
| 24 | 5.5% Citric Acid | Carboxylic acid |
| 25 | 2.6% Lactic acid | Carboxylic acid |
| 26 | 4.3% Tartaric acid | Carboxylic acid |
| 27 | 3.3% Maleic acid | Carboxylic acid |
| 28 | 5.7% Sulfosuccinic | Carboxylic acid |
| 29 | 1.7% Acetic acid | Carboxylic acid |
| 30 | 1.3% Formic acid | Carboxylic acid |
| 31 | 2.6% Oxalic acid | Carboxylic acid |
| 32 | 6.8% 1,2,3,4-Butanetetracarboxylic Acid | Carboxylic acid |
| 33 | 7.2% Tetrahydrofuran tetracarboxylic Acid | Carboxylic acid |

EXAMPLE 34

Reduced Post Develop Defects with Use of Polymer (Poly(Vinyl Alcohol))

Further coating compositions of the inventions were prepared by admixing the following components in the following amounts based on total composition weight:
0.013 weight % to 0.080 weight % Poly(vinyl alcohol), 80% hydrolyzed
0.080 weight % Perfluorobutane sulfonic acid
0.027 weight % Dodecyl benzene sulfonic acid
2.650 weight % Colloidal silica, <20 nm
2.000 weight % 1-Propanol
95.230 weight % to 95.163 weight % Water The formulated composition was spin coated onto a dried photoresist layer that had been applied to a silicon wafer substrate. The above stack was then baked at 110° C./60 sec. and then developed for 45 seconds with 0.26N TMAH developer.

By increasing the polyvinyl alcohol loading from 0% through 3% of total solids (0%-0.080% of solution), post develop residue can be significantly decreased or eliminated, as shown by scanning electron micrograph of the processed wafer substrate.

EXAMPLE 35

Improved Coat Quality with Hydrolyzed PVA

A further coating composition of the inventions was prepared by admixing the following components in the following amounts based on total composition weight:
0.053 weight % Poly(vinyl alcohol), Variable degree of hydrolysis
0.080 weight % Perfluorobutane sulfonic acid
0.027 weight % Dodecyl benzene sulfonic acid
0.080 weight % Surfynol-104
2.650 weight % Colloidal silica, <20 nm
2.000 weight % 1-Propanol
95.110 weight % Water
The above solution was spin coated onto an unprimed silicon wafer substrate. It was found by scanning electron micrograph analysis that Increasing the degree of hydrolysis of polyvinyl alcohol improved the applied coating quality, in particular a more uniform coating was provided.

EXAMPLE 36

Preparation of Surface Modified Silica 6 nm colloidal silica stabilized with ammonium hydroxide (pH of 7.3) in a 6.3 weight % solids solution in deionized water was surface modified with various water soluble, reactive silanes.
3-(trihydroxysilyl)-1-propane-sulfonic acid, as shown below, was used as the surface modifier.
Preparation:
100 grams of a 6.3 wt % colloidal silica solution was mixed with 3-(trihydroxysilyl)-1-propane-sulfonic acid in varying ratios. The resulting solutions were then heated to 30° C. for 60 hours. Upon cooling the resulting solutions were mixed with a 5 wt % poly(ethylene oxide) solution, 2000 Mn, in a 1:1 volume ratio to check for compatibility. The solutions were also coated on silicon substrates to check film properties.

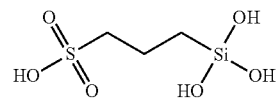 [SMILES: O=S(=O)(O)CCC[Si](O)(O)O]

EXAMPLE 37

Coating Composition Comprising Modified Silica

A further coating composition of the inventions was prepared by admixing the following components in the following amounts based on total composition weight:
0.013 weight % Poly(vinyl alcohol)
0.027 weight % Dodecyl benzene sulfonic acid
0.080 weight % Surfynol-104
2.650 weight % Colloidal silica, Sulfonic acid modified (23 wt % silane)
2.000 weight % 1-Propanol
95.230 weight % Water
The modified silica was prepared as described in Example 36 above. This composition solution was spin coated onto a dried DUV photoresist layer that had been applied to an HMDS primed silicon wafer substrate. The above stack was then imaged on an ASML/300 DUV stepper. Following exposure, the wafers were baked at 110° C./60 sec. and then developed for 45 seconds with 0.26N TMAH developer. The resulting 400 nm 1:1 line/space patterns were then screened under SEM (Scanning Electron Micrograph). Improved resolution of the patterned photoresist image was seen with use of this overcoating composition relative to a comparable processed photoresist that did not include use of the overcoating composition.

EXAMPLE 38

Preparation of Additional Surface Modified Silica 6 nm colloidal silica stabilized with ammonium hydroxide (pH of 7.3) as 6.3% solids solution in deionized water was surface modified with various water soluble, reactive silanes.
Methoxy-poly(ethylene oxide)-tri(methoxy)silane, 525 Mw, as shown below, was used as the surface modifier.
Preparation:
100 grams of a 6.3 wt % colloidal silica solution was mixed with the above silane in various ratios. The resulting solutions were then heated to 40° C. for 60 hours. Upon cooling the resulting solutions were mixed with a 5 wt % poly(ethylene oxide) solution, 2000 Mn, in a 1:1 volume ratio to check for compatibility. The solutions were also coated on silicon substrates to check film properties.

| Sample | Silica 6.3% solution grams | Silica solids grams | Silane solids grams | Silane wt % | SiOH:Silane molar ratio | Compatibility with PEO | Redispersibility in Water |
|---|---|---|---|---|---|---|---|
| A | 100.00 | 6.300 | 3.250 | 34.0% | 1.5 | Yes | Yes |
| B | 100.00 | 6.300 | 2.600 | 29.2% | 1.9 | Yes | Yes |
| C | 100.00 | 6.300 | 1.950 | 23.6% | 2.5 | Yes | No |
| D | 100.00 | 6.300 | 1.300 | 17.1% | 3.7 | No | No |
| E | 100.00 | 6.300 | 0.650 | 9.4% | 7.5 | No | No |
| F | 100.00 | 6.300 | 0.325 | 4.9% | 15.0 | No | No |
| G | 100.00 | 6.300 | 0.163 | 2.5% | 29.9 | No | No |
| H | 100.00 | 6.300 | 0.000 | 0.0% | ∞ | No | No |

| Sample | Silica 6.3% solution grams | Silica solids grams | Silane solids grams | Silane wt % | SiOH:Silane molar ratio | Compatibility with PEO | Redispersibility in Water |
|---|---|---|---|---|---|---|---|
| A | 100.00 | 6.300 | 1.800 | 22.2% | 1.5 | Yes | No |
| B | 100.00 | 6.300 | 1.350 | 17.6% | 1.9 | No | No |
| C | 100.00 | 6.300 | 1.008 | 13.8% | 2.5 | No | No |
| D | 100.00 | 6.300 | 0.720 | 10.3% | 3.7 | No | No |
| E | 100.00 | 6.300 | 0.540 | 7.9% | 7.5 | No | No |
| F | 100.00 | 6.300 | 0.378 | 5.7% | 15.0 | No | No |
| G | 100.00 | 6.300 | 0.216 | 3.3% | 29.9 | No | No |
| H | 100.00 | 6.300 | 0.000 | 0.0% | ∞ | No | No |

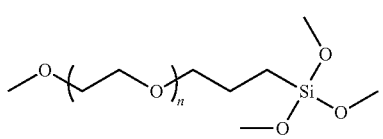

EXAMPLE 39

Coating Composition Using Additional Modified Silica

A further coating composition of the inventions was prepared by admixing the following components in the following amounts based on total composition weight:
0.013 weight % Poly(vinyl alcohol)
0.027 weight % Dodecyl benzene sulfonic acid
0.080 weight % Surfynol-104
2.650 weight % Colloidal silica, Sulfonic acid modified (22 wt % silane)
2.000 weight % 1-Propanol
95.230 weight % Water The modified silica was prepared as described in Example 38 above. The composition was spin coated onto a dried DUV photoresist layer that had been applied to an HMDS primed silicon wafer substrate. The above stack was then imaged on an ASML/300 DUV stepper. Following exposure, the wafers were baked at 135° C./60 sec. and then developed for 30 seconds with 0.26N TMAH developer. The resulting 180 nm 1:1 trench patterns were then screened under SEM. Improved resolution of the patterned photoresist image was seen with use of this overcoating composition relative to a comparable processed photoresist that did not include use of the overcoating composition.

EXAMPLE 40

High pH Coating Compositions

A further coating composition of the inventions was prepared by admixing the following components in the following amounts based on total composition weight:
0.013 weight % Poly(vinyl alcohol)
0.080 weight % Perfluorobutane sulfonic acid
0.027 weight % Dodecyl benzene sulfonic acid
2.650 weight % Colloidal silica, <20 nm
2.000 weight % 1-Propanol
95.230 weight % Water This composition (referred to TARC compositions in the Table below) was split into several bottles and then a dilute solution of ammonium hydroxide (equivalent to 2.65 wt % NH$_3$) was added at various levels. The resulting treated compositions ranged from 1:1 to 40:1 molar ratio of NH$_3$ to total acid.

The solutions were mixed with a 5 wt % poly(ethylene oxide) solution, 2000 Mn, in a 1:1 volume ratio to check for compatibility.

| Sample | TARC solution grams | Total Acid mmoles | Ammonia mmoles | Ammonia × molar acid | Compatibility with PEO |
|---|---|---|---|---|---|
| A | 100.00 | 0.1632 | 0.0000 | 0 | No |
| B | 100.00 | 0.1632 | 0.1632 | 1 | No |
| C | 100.00 | 0.1632 | 0.8160 | 5 | Yes |
| D | 100.00 | 0.1632 | 1.6320 | 10 | Yes |
| E | 100.00 | 0.1632 | 2.4480 | 15 | Yes |
| F | 100.00 | 0.1632 | 3.2640 | 20 | Yes |
| G | 100.00 | 0.1632 | 4.0800 | 25 | Yes |
| H | 100.00 | 0.1632 | 4.8960 | 30 | Yes |
| I | 100.00 | 0.1632 | 5.7120 | 35 | Yes |
| J | 100.00 | 0.1632 | 6.5280 | 40 | Yes |

EXAMPLE 41

Processing of High pH Compositions

The compositions prepared in Example 40 above were spin coated onto a dried DUV photoresist layer that had been applied to an HMDS primed silicon wafer substrate. The TARC/Resist/Si film stacks were then baked at 110° C./60 sec. to remove any ammonia ionically bound to acid. The above stacks were then imaged on an ASML/300 DUV stepper. Following exposure, the wafers were baked at 135° C./60 sec. and then developed for 30 seconds with 0.26N tetramethyl ammonium hydroxide (TMAH) developer. The resulting 180 nm 1:1 trench patterns were then screened under SEM.

EXAMPLES 42-50

Additional Coating Compositions of the Invention

EXAMPLE 42

A further coating composition of the inventions is prepared by admixing the following components in the following amounts based on total composition weight:
0.03 weight % poly(vinyl alcohol)
0.05 weight % Surfynol-104
0.08 weight % Triflic acid
2.65 weight % colloidal silica, <20 nm
97.19% water
pH of the composition is 2.8.

EXAMPLE 43

A further coating composition of the inventions is prepared by admixing the following components in the following amounts based on total composition weight:
0.03 weight % poly(vinyl alcohol)
0.05 weight % dodecyl benzene sulfonic acid
0.08 weight % Triflic acid
2.65 weight % colloidal silica, <20 nm
97.19 weight % water
pH of the composition is 2.8.

EXAMPLE 44

A further coating composition of the inventions is prepared by admixing the following components in the following amounts based on total composition weight:
0.03 weight % poly(vinyl alcohol)
0.05 weight % dodecyl ammoniopropane sulfonate
0.08 weight % Triflic acid
2.65 weight % colloidal silica, <20 nm
97.19 weight % water
pH of the composition is 3.2.

EXAMPLE 45

A further coating composition of the inventions is prepared by admixing the following components in the following amounts based on total composition weight:
0.03 weight % poly(acrylic acid)
0.08 weight % p-toluene sulfonic acid
2.65 weight % colloidal silica, <20 nm
97.24 weight % water
pH of the composition is 3.0.

EXAMPLE 46

A further coating composition of the inventions is prepared by admixing the following components in the following amounts based on total composition weight:
0.03 weight % poly(4-styrene sulfonic acid)
0.05 weight % dodecyl benzene sulfonic acid
2.65 weight % colloidal silica, <20 nm
97.27 weight % water
pH of the composition is 2.6

EXAMPLE 47

A further coating composition of the inventions is prepared by admixing the following components in the following amounts based on total composition weight:
0.03 weight % poly(vinyl alcohol)
0.05 weight % Surfynol-104
0.08 weight % Triflic acid
2.65 weight % colloidal silica, <20 nm
2% Ethanol
95.19% water
pH of the composition is 2.8.

EXAMPLE 48

A further coating composition of the inventions is prepared by admixing the following components in the following amounts based on total composition weight:
0.03 weight % poly(vinyl alcohol)
0.05 weight % Surfynol-104
0.08 weight % Perfluorobutane sulfonic acid
2.65 weight % colloidal silica, <20 nm
2 weight % Ethanol
95.19 weight % water
The silica is passed though a strong acid IX column before formulating.
pH of the composition is 2.2.

EXAMPLE 49

0.03 weight % poly(vinyl alcohol)
0.05 weight % Surfynol-104
0.08 weight % Triflic acid
2.65 weight % colloidal silica, <20 nm
2 weight % Ethanol
0.02 weight % Ammonium hydroxide
95.17 weight % water
pH of the composition is 3.6.

EXAMPLE 50

0.03 weight % poly(vinyl alcohol)
0.05 weight % Surfynol-104
0.05 weight % Dimethylbenzenesulfonium-perfluorobutane sulfonate (Photo Acid Generator)
2.65 weight % colloidal silica, <20 nm
2 weight % Propanol
95.22 weight % water
pH of the composition is 6.5.

What is claimed is:

1. A coated substrate comprising:
   (a) a coating layer of a chemically-amplified positive photoresist composition;
   (b) above the photoresist composition, an applied aqueous composition comprising a plurality of particles
   wherein the aqueous composition comprises a solvent component that is at least 50 percent water and comprises one or more water-miscible organic solvents.

2. The coated substrate of claim 1 wherein the composition above the photoresist further comprises a resin.

3. The coated substrate of claim 2 wherein the aqueous composition comprises an acid.

4. The coated substrate of claim 2 wherein the aqueous composition comprises an acid generator.

5. The coated substrate of claim 1 wherein the aqueous composition comprises an acid.

6. The coated substrate of claim 1 wherein the aqueous composition comprises an acid generator.

7. The coated substrate of claim 1 wherein the aqueous composition comprises an acid or an acid generator.

8. A method for processing an electronic device substrate, comprising:
   (a) applying a chemically-amplified positive photoresist layer on substrate;
   (b) applying above the photoresist layer an aqueous composition that comprises one or more silicon, antimony, aluminum, yttrium, cerium, lanthanum, tin, titanium, zirconium, hafnium, indium or zinc compounds,
   wherein the aqueous composition comprises a solvent component that is at least 50 percent water and comprises one or more water-miscible organic solvents.

9. The method of claim 8 further comprising immersion exposing the photoresist layer.

10. The method of claim 8 wherein the aqueous composition comprises colloidal silica, hafnia or zirconia.

11. The method of claim 10 wherein the aqueous composition has a solvent component that is at least 60 percent water.

12. The method of claim 8 wherein the aqueous composition comprises an acid.

13. The method of claim 8 wherein the aqueous composition comprises an acid generator.

14. A coated substrate comprising:
   (a) a coating layer of a chemically-amplified positive photoresist composition;
   (b) above the photoresist composition, an aqueous composition that comprises 1) hafnia or zirconia and 2) one or more resin distinct from hafnia or zirconia, wherein the aqueous composition has a solvent component that is at least 50 percent water.

15. The coated substrate of claim 14 wherein the aqueous composition comprises an acid.

16. The coated substrate of claim 14 wherein the aqueous composition comprises an acid generator.

17. The coated substrate of claim 14 wherein the solvent component of the aqueous composition comprises one or more water-miscible organic solvents.

18. A coated substrate comprising:
   (a) a coating layer of a chemically-amplified positive photoresist composition;
   (b) above the photoresist composition, an applied aqueous composition comprising a plurality of particles,
   wherein the aqueous composition comprises 1) an acid or acid generator and 2) a solvent component that is at least 50 percent water and comprises one or more water-miscible organic solvents.

19. The coated substrate of claim 18 wherein the aqueous composition has a solvent component that is at least 60 percent water.

* * * * *